(12) United States Patent
An

(10) Patent No.: US 7,760,199 B2
(45) Date of Patent: Jul. 20, 2010

(54) SOURCE DRIVER CONTROLLING SLEW RATE

(75) Inventor: Chang-Ho An, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 926 days.

(21) Appl. No.: 11/443,308

(22) Filed: May 31, 2006

(65) Prior Publication Data

US 2006/0279356 A1  Dec. 14, 2006

(30) Foreign Application Priority Data

May 31, 2005  (KR) .................. 10-2005-0046359

(51) Int. Cl.
*G06F 3/38*  (2006.01)

(52) U.S. Cl. .................................................. 345/204

(58) Field of Classification Search ........... 345/98–100, 345/204, 87, 94, 211–213; 326/87; 327/111, 327/170; 330/252–261, 278, 291, 294
See application file for complete search history.

(56) References Cited

U.S. PATENT DOCUMENTS

| | | | | |
|---|---|---|---|---|
| 5,949,259 A * | 9/1999 | Garcia | ......................... | 327/111 |
| 6,297,677 B1 * | 10/2001 | Ang et al. | .................... | 327/170 |
| 6,496,175 B1 * | 12/2002 | Fukuo | ......................... | 345/99 |
| 6,509,794 B1 * | 1/2003 | Giacomini | .................. | 330/252 |
| 6,556,162 B2 * | 4/2003 | Brownlow et al. | .......... | 341/145 |
| 6,670,941 B2 * | 12/2003 | Albu et al. | .................... | 345/98 |
| 6,924,669 B2 * | 8/2005 | Itoh et al. | ...................... | 326/87 |
| 7,053,660 B2 * | 5/2006 | Itoh et al. | ...................... | 326/87 |
| 7,245,165 B2 * | 7/2007 | De Langen | ................. | 327/170 |

FOREIGN PATENT DOCUMENTS

| | | |
|---|---|---|
| JP | 2000-295044 | 10/2000 |
| JP | 2001-343944 | 12/2001 |
| JP | 2001-343944 A | 9/2002 |
| KR | 1999-0081272 | 11/1999 |
| KR | 10-2002-0069412 A | 12/2001 |

* cited by examiner

*Primary Examiner*—Sumati Lefkowitz
*Assistant Examiner*—Rodney Amadiz
(74) *Attorney, Agent, or Firm*—Harness, Dickey & Pierce, P.L.C.

(57) ABSTRACT

A source driver employed in a liquid crystal display device uses a slew-rate control signal to regulate a slew rate of its output buffers, which makes an output voltage selectively operable at a low slew rate. Such a source driver can reduce (if not prevent) distortion of a common voltage.

11 Claims, 10 Drawing Sheets

SOURCE DRIVER CONTROLLING SLEW RATE

PRIORITY STATEMENT

This U.S. non-provisional patent application claims priority under 35 U.S.C. §119 of Korean Patent Application 2005-46359 filed on May 31, 2005, the entire contents of which are hereby incorporated by reference.

BACKGROUND

The subject matter disclosed herein is concerned with liquid crystal display (LCD) devices, which in particular relates to source drivers employed in LCD devices.

LCD devices are widely used in notebook computers, LCD televisions, mobile phones, and so forth on their merits of miniaturization and low power consumption. Especially, LCD devices of active matrix type, utilizing thin-film transistors (TFT) as switching elements, are highly adaptable to displaying motion pictures.

FIG. 1 is a schematic diagram showing a conventional, general LCD device. Referring to FIG. 1, the LCD device has an LCD panel 3000, a source driver block 1000 including pluralities of source drivers connected to pluralities of source lines SL, and a gate driver block 2000 including pluralities of gate drivers GD connected to pluralities of gate lines GL. The source line is also referred to as data line or channel.

Source drivers (SD) 100 of the source driver block 1000 activate the source lines SL arranged on the LCD panel 3000, respectively. Gate drivers (GD) 200 of the gate driver block 2000 activate the gate lines GL arranged on the LCD panel 3000, respectively.

The LCD panel 3000 includes pluralities of pixels 300. Each pixel is composed of a switching transistor TR, a storage capacitor CST reducing current leakage from the pixel, and a liquid crystal capacitor CLC. The switching transistor TR is turned on or off in response to a signal driving the gate line GL. The switching transistor TR is connected to the source line SL through the drain terminal thereof. The storage capacitor CST is coupled between the source terminal of the switching transistor TR and a ground voltage terminal VSS. The liquid crystal capacitor CLC is coupled between the source terminal of the switching transistor TR and a common voltage terminal VCOM. For example, the common voltage VCOM may be half of a power source voltage, i.e., VDD/2.

FIG. 2 is a circuit diagram of the conventional source driver 100 shown in FIG. 1. Referring to FIG. 2, the source driver 100 includes a digital-to-analogue converter (DAC) 110, output buffers 120, output switches 130, and charge-sharing switches 140.

The DAC 110 transforms digital image signals into analogue image signals. The analogue image signals from the DAC 110 represent gray-level voltages.

The output buffers 120 amplify the analogue image signals and transfer the amplified signals to the output switches 130, respectively. The output switches 130 generate source-line driving signals Y1~Yn from the amplified analogue image signals, respectively, in response to output-switch control signals OSW and /OSW. The source-line driving signals Y1~Yn are applied to loads (LD) 150 that are connected to the source lines.

FIG. 3 is a circuit diagram of the conventional output buffer 120 shown FIG. 2. Referring to FIG. 3, the output buffer 120 is a rail-to-rail operation amplifier. The output buffer 120 includes an input circuit 121, an amplifier circuit 122, a capacitive circuit 123, and an output circuit 124, in the configuration of voltage follower where an output signal OUT is inverted and fed back as input signals INP and INN through a feedback loop. The first input signal INP is the analogue image signal and the second input signal INN is the source-line driving signal.

A slew rate of the output voltage from the convention output buffer 120 is given by the following equation.

$$SR \equiv \frac{dVout}{dt} \equiv \frac{(IMP3 + IMN3)}{2C} \quad (1)$$

In Equation 1, Vout is the output voltage of the output buffer 120. IMP3 denotes the amount of current flowing through a third PMOS transistor MP3, and IMN3 denotes the amount of current flowing through a third NMOS transistor MN3. C represents capacitance of a capacitor of the capacitive circuit 123.

FIG. 4 is a timing diagram for the conventional output buffer 120 showing distortion in the common voltage caused by an increased slew rate of a source-line driving signal. When a slew rate of the source-line driving signal (e.g., Y1 of FIG. 2) becomes higher, the source-line driving signal Y1 abruptly increases or decreases. Thus, it results in distortion of the common voltage VCOM that is being coupled to the source-line driving signal Y1 and the source line SL. From the distortion of the common voltage VCOM, there occurs the phenomenon of noises on the display panel or image blinking.

SUMMARY OF THE INVENTION

One or more embodiments of the present invention provide a source driver that can control its output buffers to selectively exhibit a lower slew rate to reduce (if not prevent) distortion of a common voltage therein.

An embodiment of the present invention provides a source driver, of a liquid crystal display device, comprising: a plurality of output buffers to drive source lines; a voltage sharing unit to share voltage levels of the source lines during a charge-sharing time interval; and a controller to regulate slew rates of the output buffers according to (e.g., at an end of) the charge-sharing interval.

Additional features and advantages of the present invention will be more fully apparent from the following detailed description of example embodiments, the accompanying drawings and the associated claims.

BRIEF DESCRIPTION OF THE FIGURES

The accompanying drawings are intended to depict example embodiments of the present invention and should not be interpreted to limit the scope thereof. The accompanying drawings are not to be considered as drawn to scale unless explicitly noted.

Non-limiting and non-exhaustive embodiments of the present invention will be described with reference to the following figures, wherein like reference numerals refer to like parts throughout the various figures unless otherwise specified. In the figures.

DETAILED DESCRIPTION OF PREFERRED EMBODIMENTS

It will be understood that if an element or layer is referred to as being "on," "against," "connected to" or "coupled to" another element or layer, then it can be directly on, against connected or coupled to the other element or layer, or intervening elements or layers may be present. In contrast, if an element is referred to as being "directly on", "directly connected to" or "directly coupled to" another element or layer, then there are no intervening elements or layers present. Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular example embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, discussion begins concerning example embodiments of the present invention in the context of the accompanying drawings.

Figure 5:
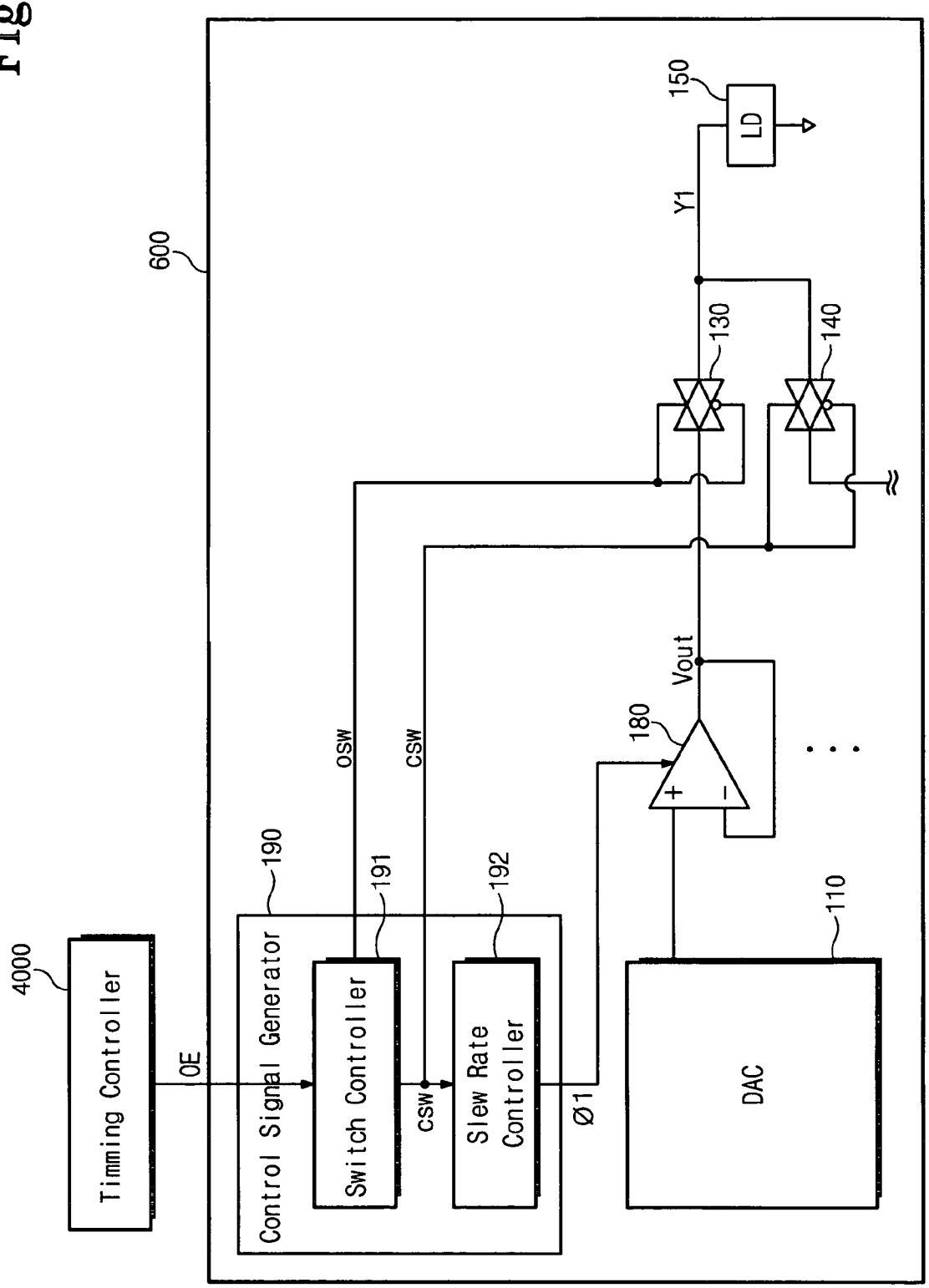
FIG. 5 is a circuit diagram illustrating a scheme for controlling a slew rate of an output voltage in a source driver, according to an example embodiment of the present invention.

FIG. 5 is a circuit diagram illustrating a scheme for controlling a slew rate of an output voltage in a source driver 600, according to an example embodiment of the present invention Referring to FIG. 5, the source driver 600 is comprised of a DAC 110, output buffers 180 (e.g., rail-to-rail operational amplifiers), output switches 130, charge-sharing switches 140, loads 150, and a control signal generator 190. While FIG. 5 actually depicts single instances of the output buffers, the switches, and loads as a simplification, it is to be understood that such are comprised in pluralities.

The DAC 110 transforms digital image signals into analogue image signals. The analogue image signals from the DAC 110 represent gray-level voltages.

The output buffers 180 amplify the analogue image signals and transfer the amplified signals to the output switches 130, respectively. The output switches 130 generate source-line driving signals Y1~Yn from the amplified analogue image signals, respectively, in response to output-switch control signals OSW and /OSW. The source-line driving signals Y1~Yn are applied each to loads (LD) 150, the latter being connected to the source lines (not depicted in FIG. 5).

The charge-sharing switches 140 enable charges, which are stored in the loads 150 connected to the source lines, to be shared by the source lines in response to activations of the sharing-switch control signals CSW and /CSW, setting the source-line driving signals to achieve an appropriate precharging voltage. The precharging voltage may be, e.g., VDD/2 when voltages of the adjacent source-line driving signals are opposite to each other in polarity (e.g., when a voltage of the first source-line driving signal Y1 is a positive voltage between VDD and VDD/2 while a voltage of the second source-line driving signal Y2 is a negative voltage between VDD/2 and VSS). This charge-sharing pattern is mostly used in source drivers for large-scaled LCD panels in order to reduce loads of the output buffer in terms of supplying current.

Before the output switches 130 are turned on, the charge-sharing switches 140 control all of the source-line driving signals to be settled on VDD/2 during a charge-sharing time. Namely, after precharging all the source-line driving signals on VDD/2, the output switches 130 can be turned on to transfer the amplified source-line driving signals to the loads LD.

The control signal generator 190 includes a switch controller 191 and a slew-rate controller 192. The switch controller 191 receives an output enable signal OE (from a timing controller 4000 external to the source driver 600), and generates control signals CSW and OSW for the output switches 130 and 140, respectively. The slew-rate controller 192 receives the sharing-switch control signal CSW from the switch controller 191 and then generates a slew-rate control signal φ1. The slew-rate control signal φ1 is applied to the output buffer 180 to regulate a slew rate of its output voltage Vout. The slew-rate control signal φ1 is activated when the sharing-switch control signal CSW transitions, e.g., to low level from high level, so as to cycle with the sharing-switch control signal CSW.

Figure 6:
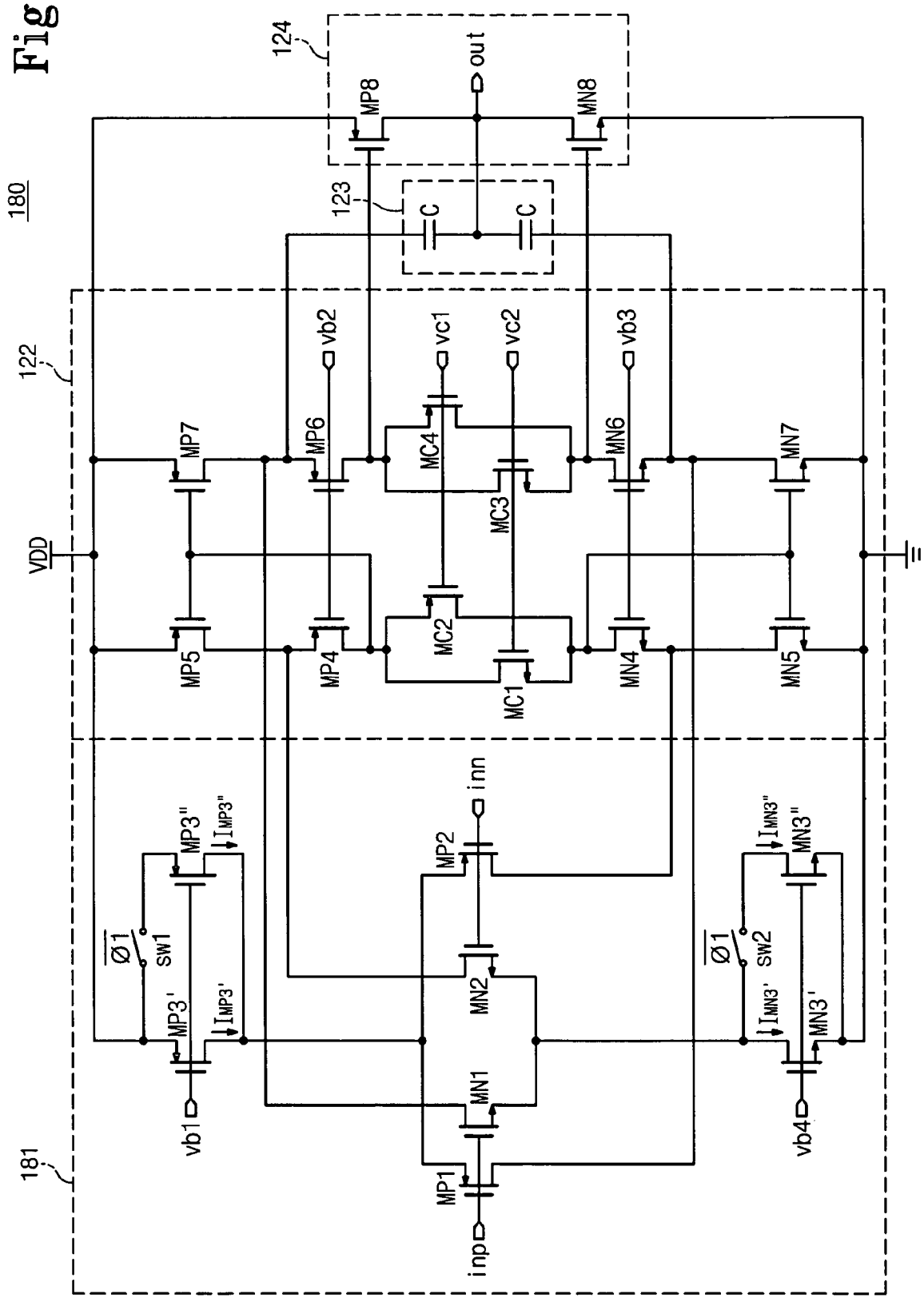
FIG. 6 is a circuit diagram illustrating in more detail (according to an example embodiment of the present invention) the output buffer shown in FIG. 5.

FIG. 6 is a circuit diagram illustrating in more detail (according to an example embodiment of the present invention) the output buffer 180 shown in FIG. 5.

In FIG. 6, the output buffer 180 is comprised of an input circuit 181, an amplifier circuit 122, and an output circuit 124. The structural configuration of the output buffer 180 is that of a voltage follower where an output signal OUT can be inverted and fed back as input signals INP and INN through a feedback loop. The first input signal INP is the analogue image signal and the second input signal INN is the source-line driving signal.

The input circuit 181 includes PMOS transistors, MP1, MP2, MP3' and MP3", and NMOS transistors MN1, MN2, MN3' and MN3". The first and second input signals INP and INN are received by MP1 & MN1 and MP2 & MN2, respectively.

Figure 1:
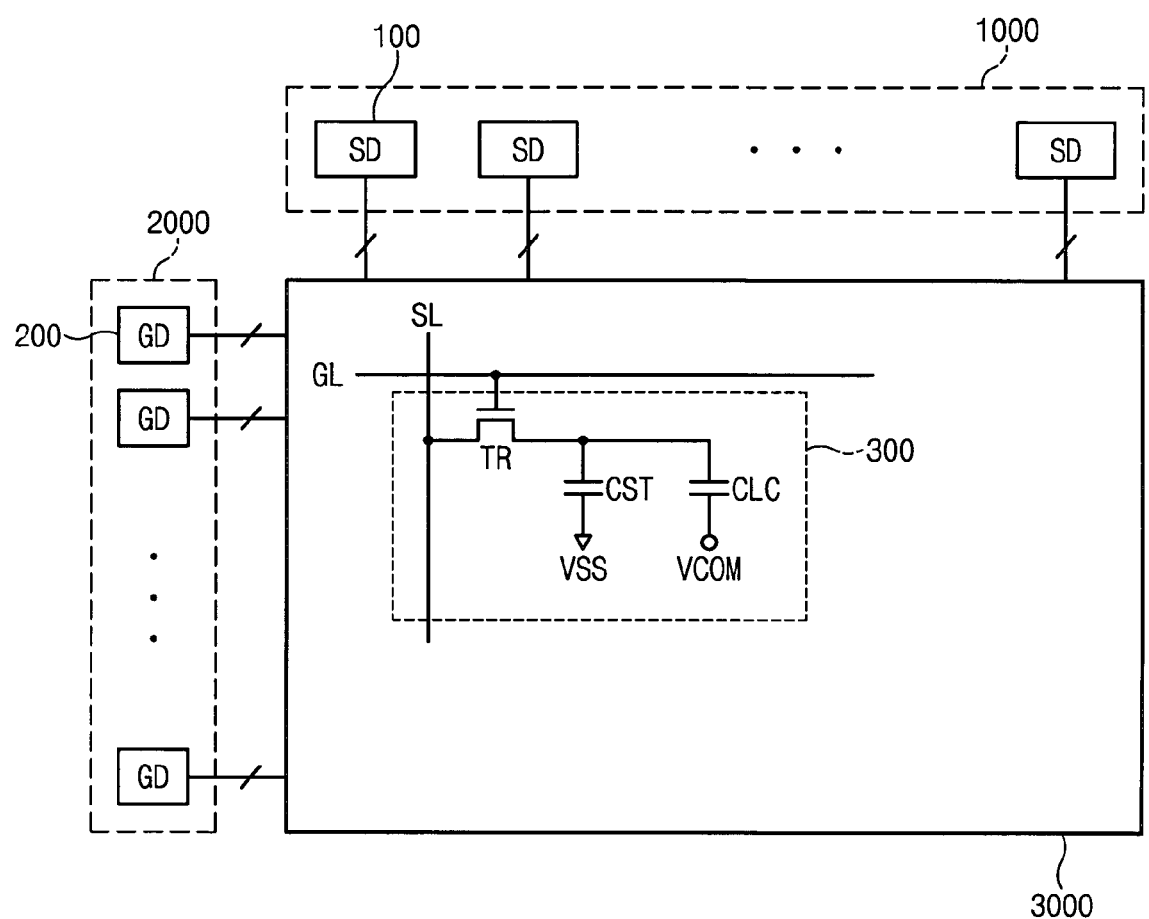
FIG. 1 is a schematic diagram showing a conventional general liquid crystal display device.
Figure 2:
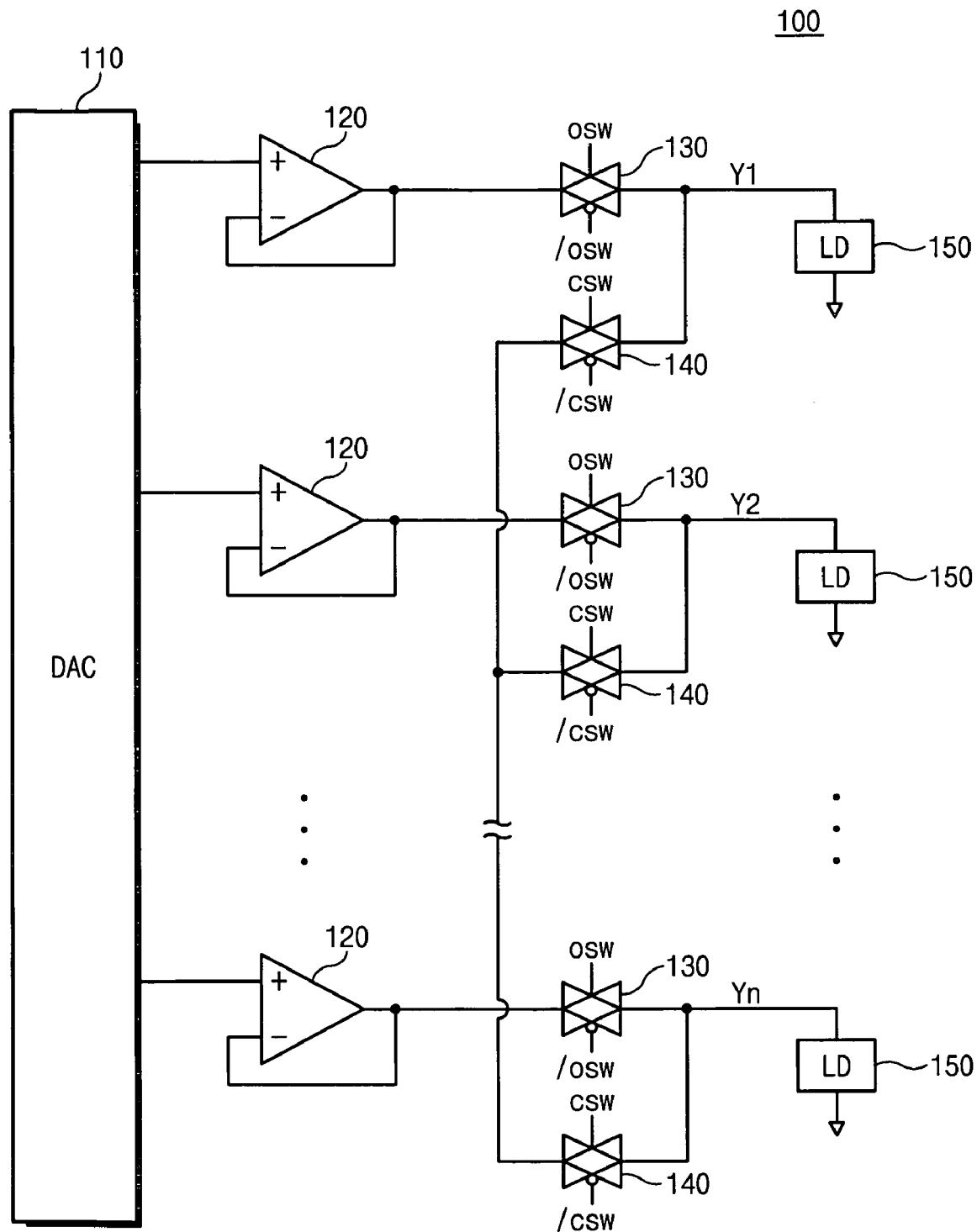
FIG. 2 is a circuit diagram of the conventional source driver shown in FIG. 1.
Figure 3:
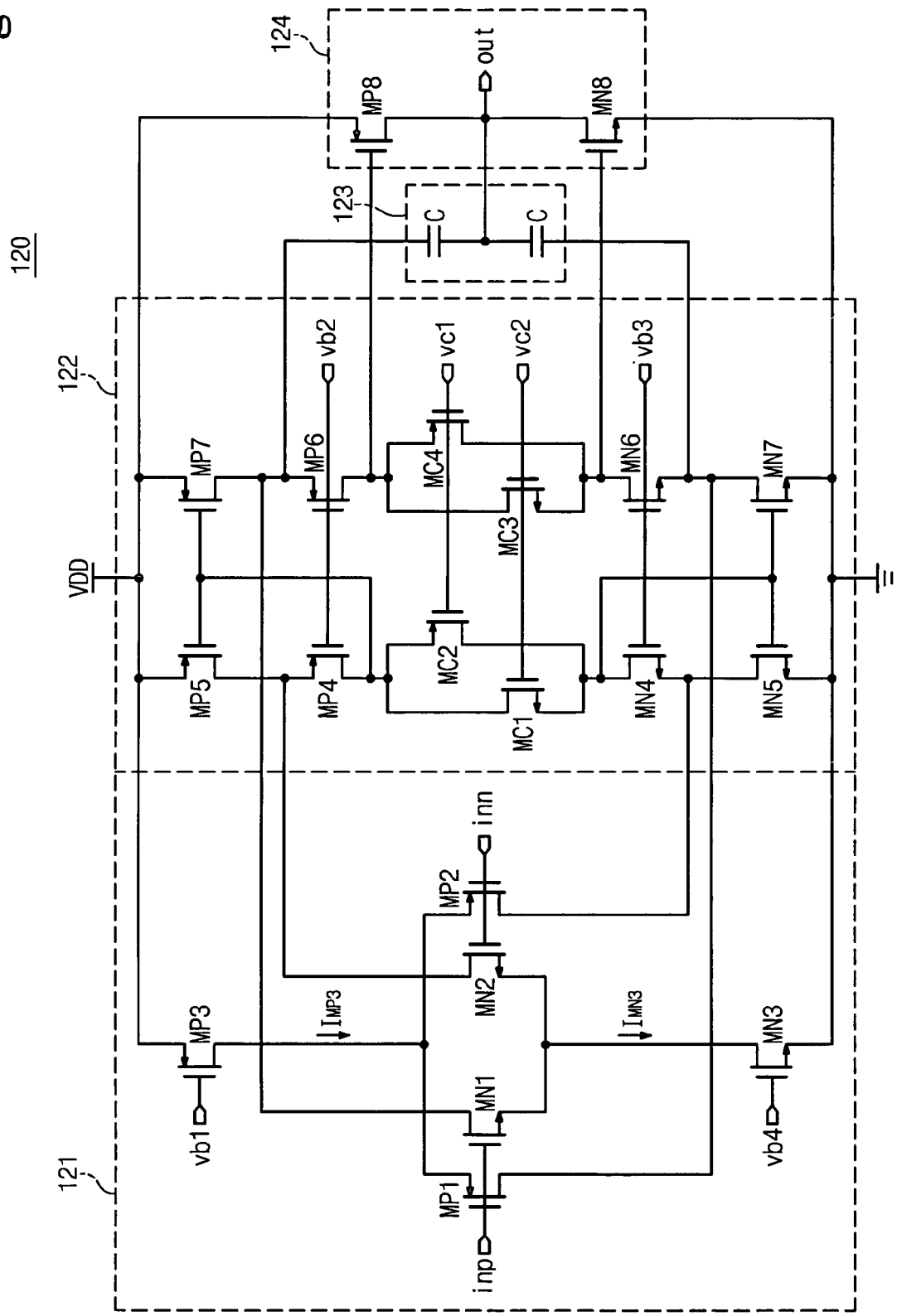
FIG. 3 is a circuit diagram of the conventional output buffer shown FIG. 2.
Figure 4:
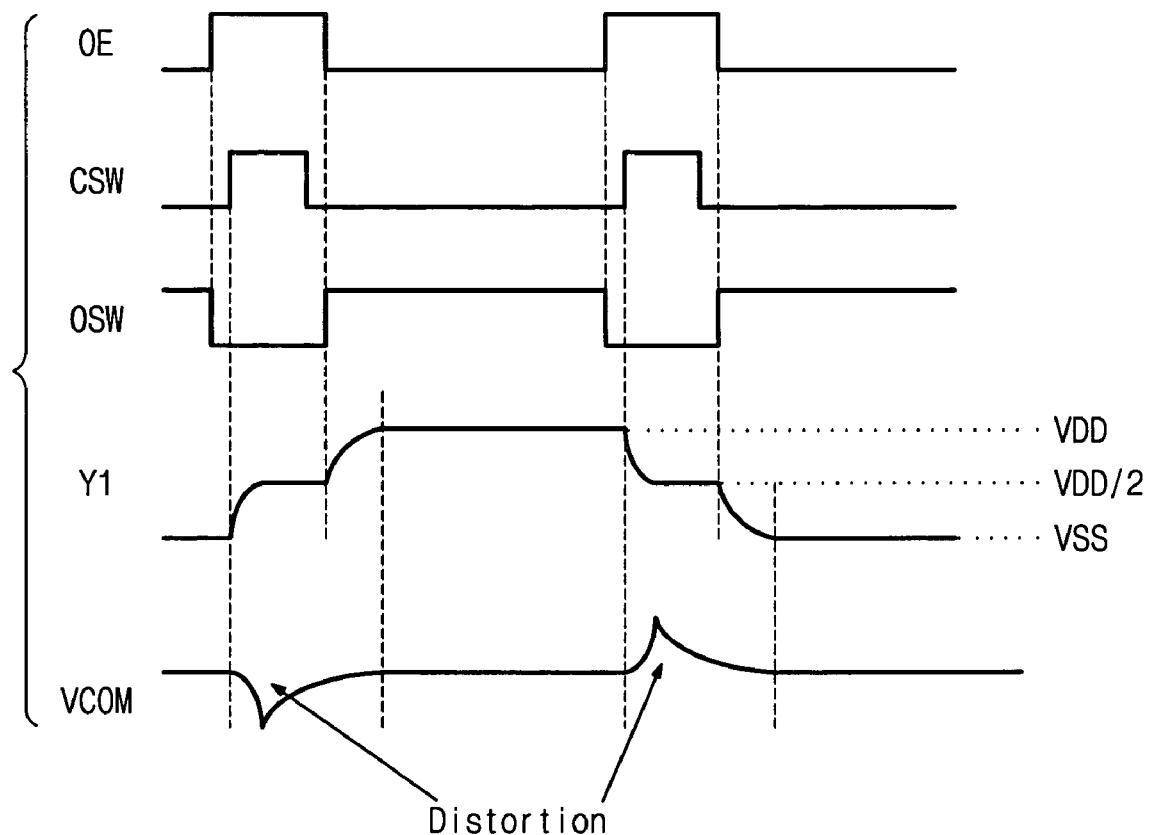
FIG. 4 is a timing diagram for the conventional output buffer of FIG. 3 showing distortion in the common voltage caused by a source-line driving signal.

The input circuit 181 of the output buffer 180 shown in FIG. 6 is different from the input circuit 121 of the conventional output buffer 120 of FIG. 3, e.g., in terms of the configurations relevant to the third PMOS and NMOS transistors MP3 and MN3. The PMOS transistor MP3 of FIG. 3 is replaced with a couple of PMOS transistors MP3' and MP3" connected in parallel. The NMOS transistor MN3 of FIG. 3 is replaced with a couple of NMOS transistors MN3' and MN3" connected in parallel. The PMOS transistors MP3' and MP3" are controlled by a first switch SW1 while the NMOS transistors MN3' and MN3" are controlled by a second switch SW2. Each of the PMOS transistors MP3' and MP3" is about half of the size of the PMOS transistor MP3. Each of the NMOS transistors MN3' and MN3" is sized about half of the sized the NMOS transistor MN3. The first and second switches, SW1 and SW2, are controlled by the inverted slew-rate control signal/φ1.

The amplifier circuit 122 is configured as a folded cascode circuit, comprising PMOS transistors MP4~MP7, NMOS transistors MN4~MN7, and cascode transistors MC1~MC4, receiving signals from the input circuit 181 and amplifying the input signals INP and INN. A bias voltage vb2 is applied to gates of the fourth and sixth PMOS transistors MP4 and MP6, while a third bias voltage vb3 is applied to gates of the fourth and sixth NMOS transistors MN4 and MN6. And, a first control voltage vc1 is applied to gates of the second and fourth cascode transistors MC2 and MC4, while a second control bias voltage vc2 is applied to gates of the first and third cascode transistors MC1 and MC3.

The capacitive circuit 123 includes two capacitors C, stabilizing a frequency characteristic of the output signal OUT. The capacitive circuit 123 regulates the output signal OUT produced by the output buffer 180 so as to reduce (if not prevent) oscillation. The capacitive circuit 123 is so called a miller compensation capacitive circuit.

The output circuit 124 includes a PMOS transistor MP8 and an NMOS transistor MN8, generating the output signal OUT of the output buffer 180 from output signals of the amplifier circuit 122. The output signal OUT functions as the source-line driving signal.

The slew rate of the output buffer 180 becomes high or low depending on operational patterns of the first and second switches SW1 and SW2 as controlled by the slew-rate control signal φ1.

If the first and second switches SW1 and SW2 are turned on by the slew-rate control signal φ1, then the output voltage Vout (i.e., the output signal OUT) is generated with a higher slew rate that can be the same, e.g., as is exhibited by the conventional output buffer 120. Such a high slew rate can be described as follows.

$$SR \equiv \frac{dVout}{dt} \equiv \frac{(IMP3' + IMP3' + IMN3' + IMN3')}{2C} \equiv \frac{(IMP3 + IMN3)}{2C} \tag{2}$$

If the first and second switches SW1 and SW2 are turned off by the slew-rate control signal φ1, then the output voltage Vout is generated with a lower slew rate, e.g., that can be about half of that of the higher slew rate. Such a low slew rate is valued as follows.

$$SR \equiv \frac{dVout}{dt} \equiv \frac{(IMP3' + IMN3')}{2C} \tag{3}$$

Therefore, it is possible to regulate the slew rate of the output voltage Vout, which is generated from the output buffer 180, by the slew-rate control signal φ1. In other words, as the slew rate of the output voltage Vout is controlled to be the lower value in a specific period, it reduces (if not prevents) the distortion of the common voltage VCOM.

Figure 7:
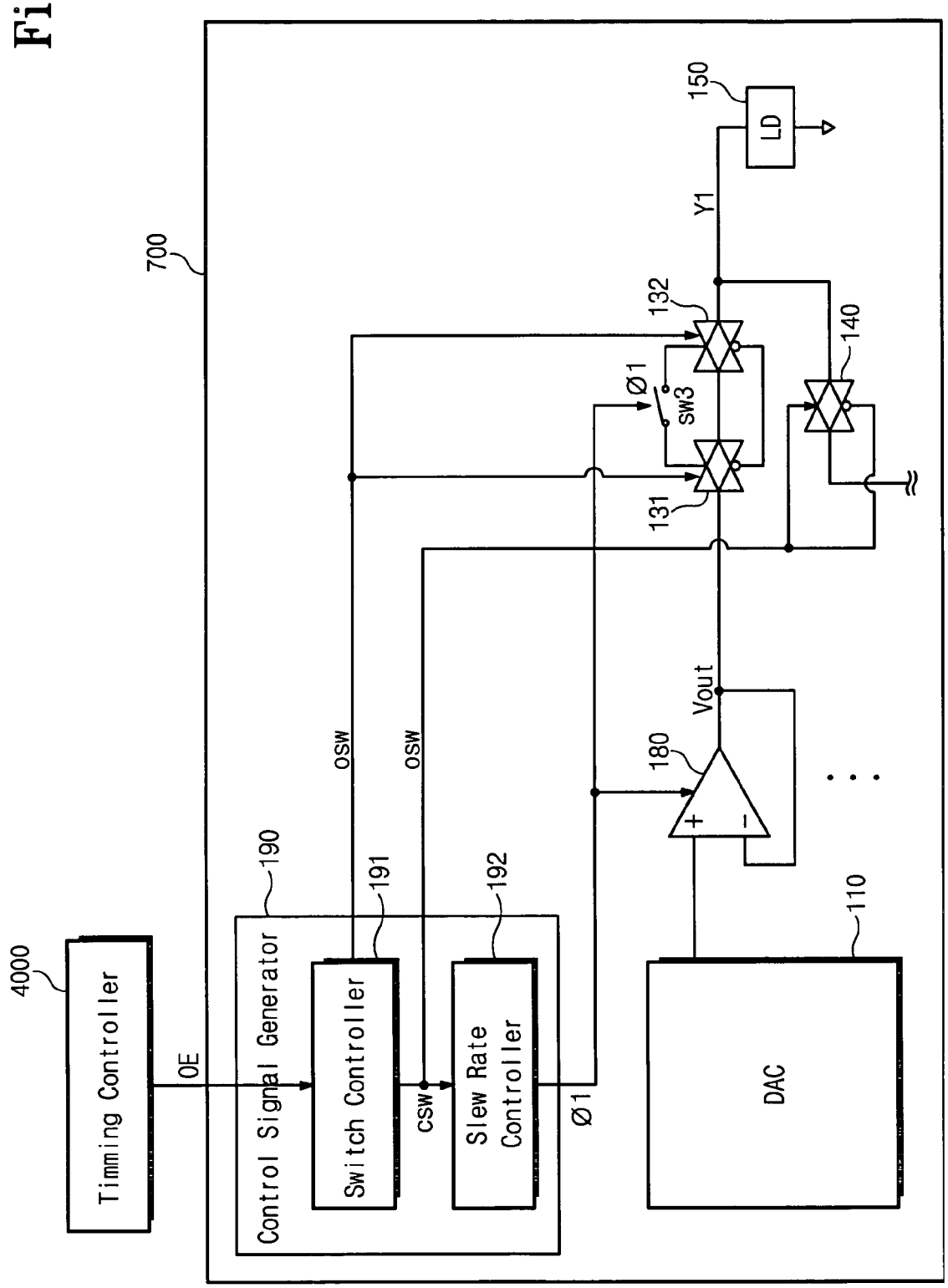
FIG. 7 is a block diagram illustrating a scheme for reducing a slew rate by an output switch, according to an example embodiment of the present invention.

FIG. 7 is a block diagram illustrating a scheme for reducing a slew rate by output switches, according to an example embodiment of the present invention.

Referring to FIG. 7, output switches 131 and 132 are connected to each other through a third switch SW3, increasing output resistance to further reduce the amount of current flowing through the output circuit 124, so as to reduce (if not prevent) the distortion of the common voltage VCOM. The third switch SW3 is controlled by the slew-rate control signal φ1, as are the first and second switches SW1 and SW2 in the output buffer 180. Alternatively, output buffer 180 could be replaced by conventional output buffer 120 such that only switches SW3 receive the slew-rate control signal φ1.

Figure 8A:
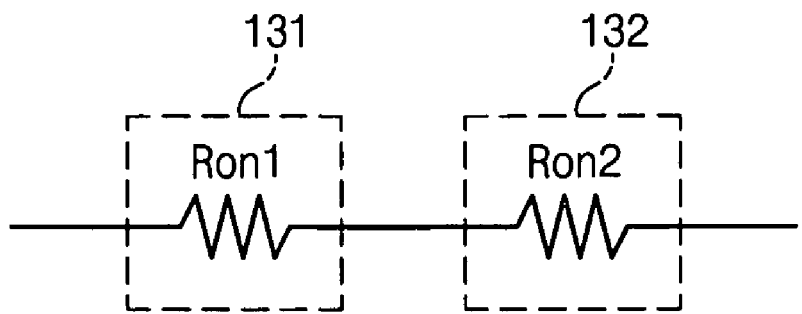
FIGS. 8A and 8B are circuit diagrams illustrating connection arrangements of the output switches of FIG. 7, according to example embodiments of the present invention, respectively.
Figure 8B:
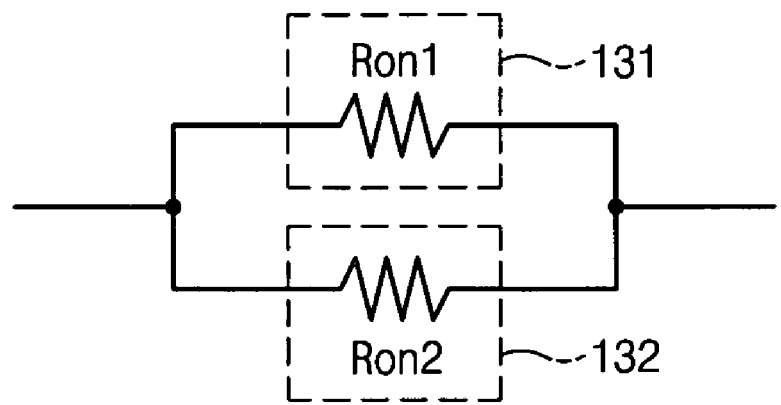

FIGS. 8A and 8B are circuit diagrams illustrating connection arrangements of the output switches 131 and 132 of. FIG. 7, according to the slew-rate control signal φ1.

In FIGS. 8A and 8B, the output switches 131 and 132 are connected in series and in parallel to increase or decrease the output resistance Ron, respectively.

Figure 9:
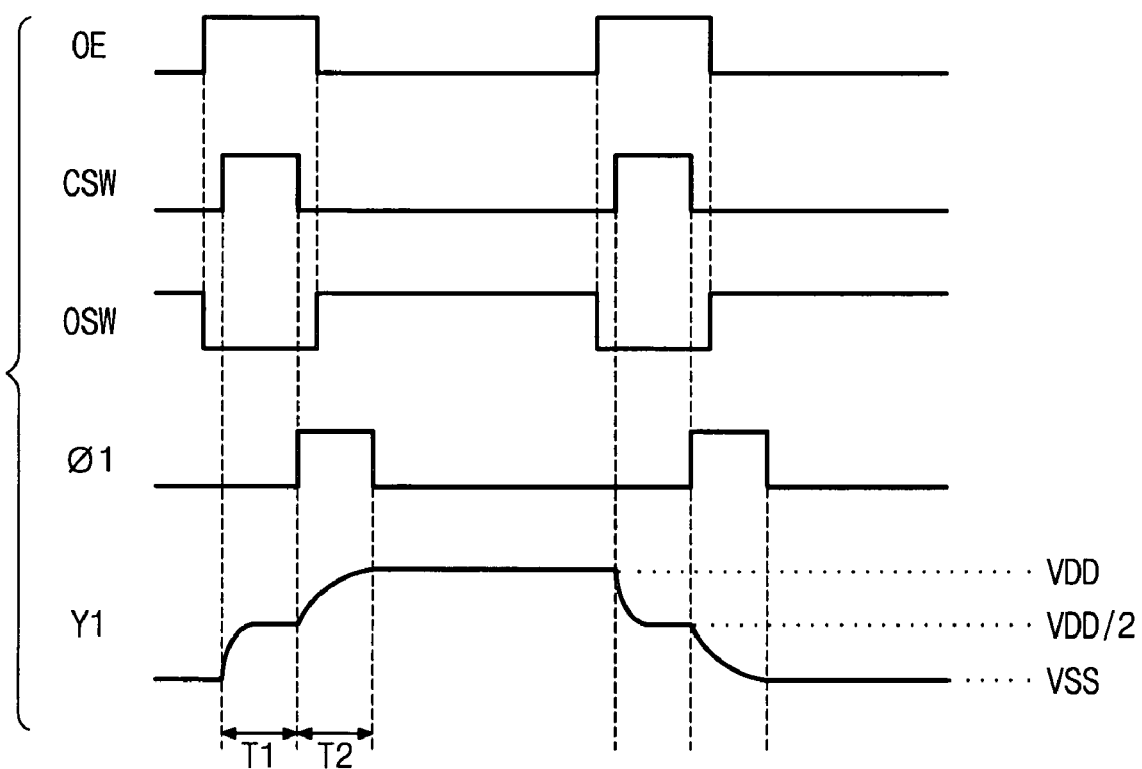
FIG. 9 is a timing diagram showing variation of a source-line driving signal by a slew-rate control signal, according to an example embodiment of the present invention.

FIG. 9 is a timing diagram showing variation of the source-line driving signal by the slew-rate control signal φ1, according to an example embodiment of the present invention.

In FIG. 9, when there is an input of the output enable signal OE from a timing controller 4000, the output-switch control signal OSW is activated followed shortly by the sharing-switch control signal CSW. The slew-rate control signal φ1 is active with the following edge of the sharing-switch control signal CSW so as, in effect, to be delayed by a time T1. The delay time T1 can be, e.g., the same as an active period T2 of the slew-rate control signal φ1. If the slew-rate control signal φ1 is activated, then the output buffer 180 operates with the low slew rate in the period T2. Thus, it reduces (if not prevents) the distortion of the common voltage VCOM that arises from a fast rising-up of the output voltage.

Figure 10:
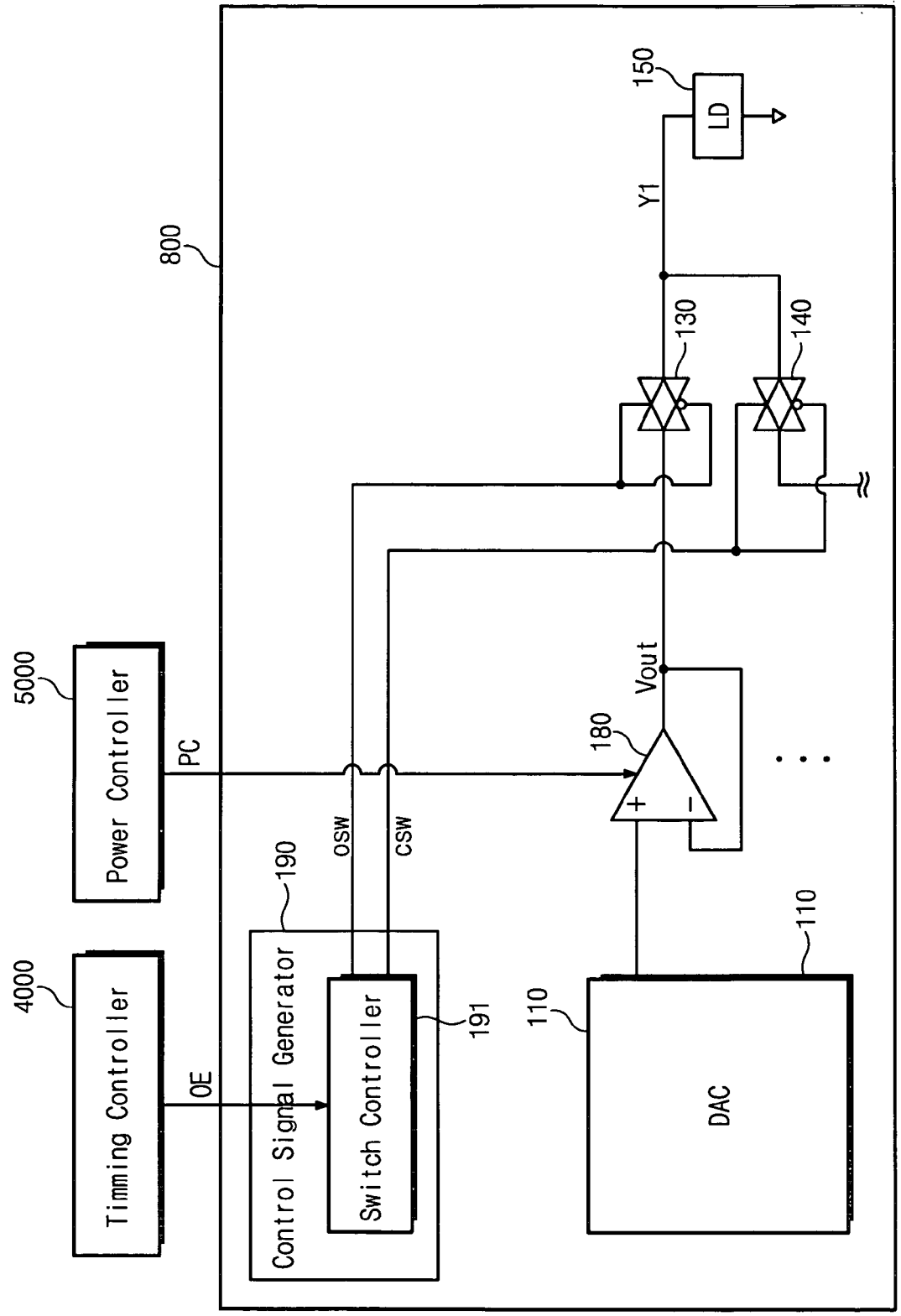
FIG. 10 is a block diagram illustrating a scheme for reducing a slew rate of the output buffer by a power control signal, according to an example embodiment of the present invention.

FIG. 10 is a block diagram illustrating a scheme for reducing a slew rate of the output buffer by a power control signal, according to an example embodiment of the present invention.

While the features shown in FIGS. 5 and 7 make the output buffer 180 operable with the low slew rate in a specific period (e.g., T2) according to the slew-rate control signal φ1, FIG. 10 shows the feature that the output buffer 180 is normally operable in the mode of low slew rate, i.e., the default mode is to exhibit slew rates that are lower relative to selectively invokable higher slew rates.

Referring to FIG. 10, the first and second switches, SW1 and SW2 (of the input current 181 of the output buffer 180), are controlled by a high or low state of the power control signal PC provided from a power controller 5000. The output buffer 180 is regulated to operate with the low slew rate normally. The power control signal PC is applied to the output buffer 180, e.g., through a low power control (LPC) pin of the source driver 800.

Alternatively, the power control signal PC may be applicable to the configuration shown in FIG. 7, and used there as a signal controlling the third switch SW3 instead of the slew-rate control signal φ1.

According to one or more embodiments of the present invention, the source driver for an LCD device is selectively operable to exhibit a lower slew rate in its output voltage, thus reducing (if not preventing) the distortion of the common voltage.

With some example embodiments of the present invention having thus been described, it will be obvious that the same may be varied in many ways. Such variations are not to be regarded as a departure from the spirit and scope of the present invention, and all such modifications are intended to be included within the scope of the present invention.

What is claimed is:

1. A source driver, of a liquid crystal display device, comprising:
    a plurality of output buffers to drive source lines;
    a voltage sharing unit to share voltage levels on the source lines during a charge-sharing interval; and
    a controller configured to generate a slew-rate control signal in response to the charge-sharing interval, the slew-rate control signal being input to the plurality of output buffers, wherein
        slew rates of the plurality of output buffers vary according to the input slew-rate control signal,
        the controller generates the slew-rate control signal that is activated after an end of the charge-sharing interval, and
        the slew-rate control signal is not active during the charge-sharing interval.

2. The source driver as set forth in claim 1, wherein an interval of the slew-rate control signal is equal to the charge-sharing interval.

3. The source driver as set forth in claim 1, wherein the voltage sharing unit includes a plurality of sharing switches.

4. The source driver as set forth in claim 3, wherein:
    the controller is further configured to generate a sharing-switch control signal; and the plurality of sharing switches operate according to the sharing-switch control signal.

5. The source driver as set forth in claim 1, wherein:
    the output buffers operate to selectively exhibit reduced slew rates according to the slew-rate control signal.

6. A source driver, of a liquid crystal display device, comprising:
    output buffers to drive source lines;
    output switches to regulate output voltages on the source lines;
    charge-sharing switches to share voltage levels on the source lines during a charge-sharing interval; and
    a control signal generator configured to provide a slew-rate control signal in response to the charge-sharing interval, the slew-rate control signal being input to the plurality of output buffers, and to provide switching signals for operating the output switches and the charge-sharing switches, in response to an end of the charge-sharing interval, wherein
        the slew rate control signal regulates slew rates of the output buffers and is not active during the charge-sharing interval,
        the control signal generator includes at least one of:
            a switch controller that generates the switching signals, the switching signals including an output-switch control signal and a sharing-switch control signal to regulate the output switches and the charge-sharing switches, respectively; and
            a slew-rate controller that generates the slew-rate control signal,
        the output-switch control signal and the sharing-switch control signal are generated with reference to an output enable signal received from an entity external to the source driver; and
        the slew-rate control signal is generated in response to the sharing-switch control signal.

7. The source driver as set forth in claim 6, wherein an active time of the slew-rate control signal is at least substantially the same as an active interval of the sharing-switch control signal.

8. The source driver as set forth in claim 6, wherein the output buffers further operate to selectively exhibit reduced slew rates according to the slew-rate control signal.

9. The source driver as set forth in claim 8, wherein each output buffer comprises:
    an input circuit to receive an analog image signal and an output voltage of a corresponding output buffer;
    an amplifier circuit to amplify the analog image signal;
    a capacitive circuit to stabilize a frequency characteristic of the output voltage; and
    an output circuit to drive the source line in response to signals from the amplifier circuit.

10. The source driver as set forth in claim 9, wherein the input circuit further operates to control current of a current-source transistor in response to the slew-rate control signal.

11. The source driver as set forth in claim 9, wherein each output buffer is a rail-to-rail operation amplifier.

* * * * *